(12) United States Patent
McCollum et al.

(10) Patent No.: US 10,128,852 B2
(45) Date of Patent: *Nov. 13, 2018

(54) LOW LEAKAGE RERAM FPGA CONFIGURATION CELL

(71) Applicant: Microsemi SoC Corp., San Jose, CA (US)

(72) Inventors: John L. McCollum, Orem, UT (US); Esmat Z. Hamdy, Fremont, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,216

(22) Filed: Nov. 27, 2017

(65) Prior Publication Data

US 2018/0083634 A1 Mar. 22, 2018

Related U.S. Application Data

(62) Division of application No. 15/375,014, filed on Dec. 9, 2016.

(60) Provisional application No. 62/268,704, filed on Dec. 17, 2015.

(51) Int. Cl.
| | |
|---|---|
| *G11C 13/00* | (2006.01) |
| *H03K 19/094* | (2006.01) |
| *H03K 19/177* | (2006.01) |
| *H01L 27/24* | (2006.01) |
| *H01L 23/00* | (2006.01) |
| *H01L 45/00* | (2006.01) |

(52) U.S. Cl.
CPC ....... *H03K 19/1776* (2013.01); *G11C 13/003* (2013.01); *G11C 13/0026* (2013.01); *G11C 13/0069* (2013.01); *H01L 24/26* (2013.01); *H01L 27/2436* (2013.01); *H01L 27/2454* (2013.01); *H01L 27/2463* (2013.01); *H01L 45/12* (2013.01); *H03K 19/0941* (2013.01); *G11C 2213/79* (2013.01)

(58) Field of Classification Search
CPC ............... H03K 19/0941; H01L 24/36; G11C 13/0026; G11C 13/003
USPC .......................................................... 257/2
See application file for complete search history.

(56) References Cited

U.S. PATENT DOCUMENTS

| | | | |
|---|---|---|---|
| 4,758,745 | A | 7/1988 | Elgamal et al. |
| 4,873,459 | A | 10/1989 | El Gamal et al. |
| 4,904,338 | A | 2/1990 | Kozicki |

(Continued)

OTHER PUBLICATIONS

PCT/US2016/066955, Notification of Transmittal of the International Search Report and The Written Opinion of the International Searching Authority, or the Declaration, Form PCT/ISA/220.

(Continued)

*Primary Examiner* — Robert T Huber
(74) *Attorney, Agent, or Firm* — Glass & Associates; Kenneth D'Alessandro; Kenneth Glass

(57) ABSTRACT

A low-leakage resistive random access memory cell includes a complementary pair of bit lines and a switch node. A first ReRAM device is connected to a first one of the bit lines. A p-channel transistor has a source connected to the ReRAM device, a drain connected to the switch node, and a gate connected to a bias potential. A second ReRAM device is connected to a second one of the bit lines. An n-channel transistor has a source connected to the ReRAM device a drain connected to the switch node, and a gate connected to a bias potential.

8 Claims, 6 Drawing Sheets

(56) References Cited

U.S. PATENT DOCUMENTS

| | | | |
|---|---|---|---|
| 5,229,963 A | 7/1993 | Ohtsuka et al. |
| 5,254,866 A | 10/1993 | Ogoh |
| 5,314,772 A | 5/1994 | Kozicki et al. |
| 5,463,583 A | 10/1995 | Takashina |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |
| 5,729,162 A | 3/1998 | Rouy |
| 5,761,115 A | 6/1998 | Kozicki et al. |
| 5,770,885 A | 6/1998 | Kim et al. |
| 5,801,415 A | 9/1998 | Lee et al. |
| 5,812,452 A | 9/1998 | Hoang |
| 5,896,312 A | 4/1999 | Kozicki et al. |
| 5,914,893 A | 6/1999 | Kozicki et al. |
| 5,986,322 A | 11/1999 | McCollum et al. |
| 6,063,663 A | 5/2000 | Caprara et al. |
| 6,084,796 A | 7/2000 | Kozicki et al. |
| 6,100,560 A | 8/2000 | Lovett |
| 6,137,725 A | 10/2000 | Tassan et al. |
| 6,144,580 A | 11/2000 | Murray |
| 6,222,774 B1 | 4/2001 | Tanzawa et al. |
| 6,324,102 B1 | 11/2001 | McCollum |
| 6,326,651 B1 | 12/2001 | Manabe |
| 6,348,365 B1 | 2/2002 | Moore et al. |
| 6,356,478 B1 | 3/2002 | McCollum |
| 6,388,324 B2 | 5/2002 | Kozicki |
| 6,418,049 B1 | 7/2002 | Kozicki et al. |
| 6,437,365 B1 | 8/2002 | Hawley et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,709,887 B2 | 3/2004 | Moore et al. |
| 6,768,687 B2 | 7/2004 | Kaihatsu |
| 6,784,476 B2 | 8/2004 | Kim et al. |
| 6,798,692 B2 | 9/2004 | Kozicki et al. |
| 6,815,784 B2 | 11/2004 | Park et al. |
| 6,825,489 B2 | 11/2004 | Kozicki |
| 6,847,073 B2 | 1/2005 | Kanaya |
| 6,849,891 B1 | 2/2005 | Hsu et al. |
| 6,864,500 B2 | 3/2005 | Gilton |
| 6,865,117 B2 | 3/2005 | Kozicki |
| 6,891,769 B2 | 5/2005 | McCollum et al. |
| 6,914,802 B2 | 7/2005 | Kozicki |
| 6,927,411 B2 | 8/2005 | Kozicki |
| 6,940,745 B2 | 9/2005 | Kozicki |
| 6,955,940 B2 | 10/2005 | Campbell et al. |
| 6,970,383 B1 | 11/2005 | Han et al. |
| 6,985,378 B2 | 1/2006 | Kozicki |
| 6,998,312 B2 | 2/2006 | Kozicki et al. |
| 7,006,376 B2 | 2/2006 | Kozicki |
| 7,061,036 B2 | 6/2006 | Kajiyama |
| 7,078,295 B2 | 7/2006 | Jeon et al. |
| 7,101,728 B2 | 9/2006 | Kozicki et al. |
| 7,120,053 B2 | 10/2006 | Atsumi et al. |
| 7,120,079 B2 | 10/2006 | McCollum et al. |
| 7,126,837 B1 | 10/2006 | Banachowicz et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,180,104 B2 | 2/2007 | Kozicki |
| 7,187,610 B1 | 3/2007 | McCollum et al. |
| 7,227,169 B2 | 6/2007 | Kozicki |
| 7,232,717 B1 | 6/2007 | Choi et al. |
| 7,245,535 B2 | 7/2007 | McCollum et al. |
| 7,288,781 B2 | 10/2007 | Kozicki |
| 7,294,875 B2 | 11/2007 | Kozicki |
| 7,301,821 B1 | 11/2007 | Greene et al. |
| 7,339,232 B2 | 3/2008 | Seo et al. |
| 7,368,789 B1 | 5/2008 | Dhaoui et al. |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,430,137 B2 | 9/2008 | Greene et al. |
| 7,499,360 B2 | 3/2009 | McCollum et al. |
| 7,511,532 B2 | 3/2009 | Derharcobian et al. |
| 7,519,000 B2 | 4/2009 | Caveney et al. |
| 7,560,722 B2 | 7/2009 | Kozicki |
| 7,675,766 B2 | 3/2010 | Kozicki |
| 7,692,972 B1 | 4/2010 | Sadd et al. |
| 7,728,322 B2 | 6/2010 | Kozicki |
| 7,763,158 B2 | 7/2010 | Kozicki |
| 7,816,717 B2 | 10/2010 | Ozaki |
| 7,839,681 B2 | 11/2010 | Wang et al. |
| 7,928,492 B2 | 4/2011 | Jeon et al. |
| 7,929,345 B2 | 4/2011 | Issaq |
| 8,269,203 B2 | 9/2012 | Greene et al. |
| 8,269,204 B2 | 9/2012 | Greene et al. |
| 8,415,650 B2 | 4/2013 | Greene et al. |
| 8,531,866 B2 | 9/2013 | Ikegami et al. |
| 8,735,211 B2 | 5/2014 | Greeley et al. |
| 9,128,821 B2 | 9/2015 | Chen et al. |
| 9,704,573 B1 | 7/2017 | Hecht |
| 2002/0003247 A1 | 1/2002 | Yokoyama et al. |
| 2003/0107105 A1 | 6/2003 | Kozicki |
| 2003/0222303 A1 | 12/2003 | Fukuda |
| 2004/0124407 A1 | 7/2004 | Kozicki et al. |
| 2005/0141431 A1 | 6/2005 | Caveney et al. |
| 2005/0225413 A1 | 10/2005 | Kozicki et al. |
| 2006/0028895 A1 | 2/2006 | Taussig et al. |
| 2006/0050546 A1 | 3/2006 | Roehr |
| 2006/0051927 A1 | 3/2006 | Takami |
| 2006/0086989 A1 | 4/2006 | Lee et al. |
| 2006/0171200 A1 | 8/2006 | Rinerson et al. |
| 2006/0230375 A1 | 10/2006 | Casey et al. |
| 2006/0238185 A1 | 10/2006 | Kozicki |
| 2006/0291364 A1 | 12/2006 | Kozicki |
| 2007/0045728 A1 | 3/2007 | Lee |
| 2007/0075352 A1 | 4/2007 | Irie |
| 2007/0108508 A1 | 5/2007 | Lin et al. |
| 2007/0109861 A1 | 5/2007 | Wang et al. |
| 2007/0121369 A1 | 5/2007 | Happ |
| 2007/0146012 A1 | 6/2007 | Murphy et al. |
| 2007/0165446 A1 | 7/2007 | Oliva et al. |
| 2007/0165532 A1 | 7/2007 | Retana et al. |
| 2008/0101117 A1 | 5/2008 | Ogura et al. |
| 2008/0113560 A1 | 5/2008 | Caveney et al. |
| 2008/0211540 A1 | 9/2008 | Fujita |
| 2008/0279028 A1 | 11/2008 | McCollum et al. |
| 2009/0034325 A1 | 2/2009 | Lowrey et al. |
| 2009/0184359 A1 | 7/2009 | He et al. |
| 2009/0198812 A1 | 8/2009 | Caveney et al. |
| 2009/0283740 A1 | 11/2009 | Kozicki et al. |
| 2010/0092656 A1 | 4/2010 | Kozicki |
| 2010/0100857 A1 | 4/2010 | Chen et al. |
| 2010/0135071 A1 | 6/2010 | Kozicki |
| 2010/0149873 A1 | 6/2010 | Wang et al. |
| 2010/0157688 A1 | 6/2010 | Issaq |
| 2010/0169886 A1 | 7/2010 | Troxel et al. |
| 2010/0208520 A1 | 8/2010 | Wang et al. |
| 2011/0001108 A1 | 1/2011 | Greene et al. |
| 2011/0001115 A1 | 1/2011 | Greene et al. |
| 2011/0001116 A1 | 1/2011 | Greene |
| 2011/0002167 A1 | 1/2011 | McCollum |
| 2011/0024821 A1 | 2/2011 | Wang et al. |
| 2011/0205780 A1 | 8/2011 | Yasuda et al. |
| 2012/0223381 A1 | 9/2012 | Lu et al. |
| 2013/0033921 A1 | 2/2013 | Tsuda et al. |
| 2013/0134378 A1 | 5/2013 | Liu |
| 2013/0234100 A1 | 9/2013 | An et al. |
| 2014/0071745 A1 | 3/2014 | Kawasumi |
| 2014/0151621 A1 | 6/2014 | Tendulkar |
| 2014/0158968 A1 | 6/2014 | Jo |
| 2014/0175531 A1 | 6/2014 | Huang et al. |
| 2014/0233301 A1 | 8/2014 | Lu et al. |
| 2014/0246719 A1 | 9/2014 | Dhaoui |
| 2014/0264238 A1 | 9/2014 | Jo |
| 2014/0269008 A1 | 9/2014 | Baker, Jr. |
| 2015/0188039 A1 | 2/2015 | Wang |

(56) References Cited

U.S. PATENT DOCUMENTS

| | | |
|---|---|---|
| 2015/0076439 A1 | 3/2015 | Saitoh et al. |
| 2016/0133837 A1 | 12/2016 | Hsueh |
| 2017/0345496 A1 | 11/2017 | Liu et al. |

OTHER PUBLICATIONS

PCT/US2016/066967, Notification of Transmittal of the International Search Report and The Written Opinion of the International Searching Authority, or the Declaration, Form PCT/ISA/220.

PCT/US2017/062878 International Search Report and Written Opinion, dated Mar. 28, 2018.

Aratani, et al., Aratani, K. "A Novel Resistance Memory with High Scalability and Nanosecond Switching," IEDM, 2007, pp. 783-786.

Baek, et al., Baek, L G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, Burr, G. W. et al., "Overview of Candidate Device Technologies for Storage-class Memory," IBM Journal of Research & Development, 2008, vol. 52, No. 4/5, pp. 449-464.

Choi, et al., Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, et al., Fang, T. N. et al, "Erase Mechanism for Copper Oxide Resistive Switching Memory Cells with Nickel Electrode," Int'l Electron Devices Meeting, 2006, pp. 1-4.

Greene, et al., Greene, Jonathan et al., "Antifuse Field Programmable Gate Arrays," Proceedings of the IEEE, Jul. 1993, vol. 81, No. 7, pp. 1042-1056.

Kund, et al., Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Lemieux, et al., Lemieux, G. et al., "Directional and Single-Driver Wires in FPGA Interconnect," International Conference on Field-Programmable Technology (ICFPT), Dec. 2004, pp. 41-48, Brisbane, Australia.

Meyer, Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pp.

Meyer, et al., Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, et al., Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, et al., Strukov, Dimitri B. et al., "The Missing Memristor Found," Nature, May 1, 2008, vol. 453, pp. 80-85.

Symanczyk, Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

Wei Yi et al: Feedback write scheme for memristive switching devices 11, Applied Physics A-Materials Science & Processing, Springer, Berlin, DE, vol. 102, No. 4, Jan. 27, 2011 (Jan. 27, 2011), pp. 973-982.

Yi-Chung Chen et al: "The 3-D Stacking Bipolar RRAM for High Density", IEEE Transactions on Nanotechnology, IEEE Service Center, Piscataway, NJ, US, vol. 11, No. 5, Sep. 1, 2012 (Sep. 1, 2012), pp. 948-956.

International Search Report and Written Opinion of the International Searching Authority dated Dec. 19, 2017, International application No. PCT/US2017/054174.

| Node | A | B | C | D | E | F | G | H | I | J |
|---|---|---|---|---|---|---|---|---|---|---|
| BL1 | 1.8V | 1.8V | 0V | 1.8V | 0V | 1.8V | 0V | 1.8V | 0V | 1.8V |
| BL!1 | 0V | 0V | 0V | 1.8V | 0V | 1.8V | 0V | 1.8V | 0V | 1.8V |
| WLS1 | 0V | 1.8V | 1.8V | 0V | 0V | 1.8V | 1.8V | 0V | 0V | 1.8V |
| WL1 | 1.8V | 2.5V | 2.5V | 2.5V | 2.5V | 2.5V | 0V | 0V | 0V | 0V |
| BL2 | 1.8V | 1.8V | 0V | 1.8V | 0V | 1.8V | 0V | 1.8V | 0V | 1.8V |
| BL!2 | 0V | 0V | 0V | 1.8V | 0V | 1.8V | 0V | 1.8V | 0V | 1.8V |
| WLS2 | 0V | 1.8V | 0V | 1.8V | 1.8V | 0V | 0V | 1.8V | 1.8V | 0V |
| WL2 | 1.8V | 2.5V | 0V | 0V | 0V | 0V | 2.5V | 2.5V | 2.5V | 2.5V |

A= Erase All Top ReRAM devices
B= Erase All Bottom ReRAM Devices
C= Program cell R1C1 in row 1 to "on" state
D= Program cell R1C1 in row 1 to "off" state
E= Program cell R1C2 in row 1 to "on" state
F= Program cell R1C2 in row 1 to "off" state
G= Program cell R2C1 in row 2 to "on" state
H= Program cell R2C1 in row 2 to "off" state
I= Program cell R2C2 in row 2 to "on" state
J= Program cell R2C2 in row 2 to "off" state

FIG. 6

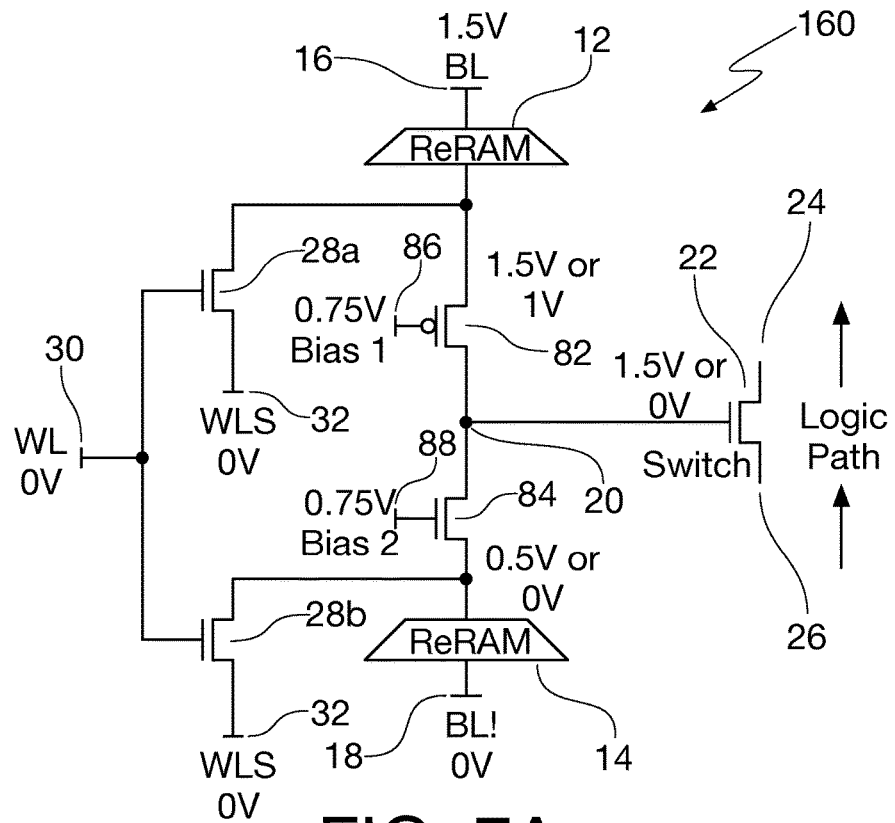
FIG. 7A
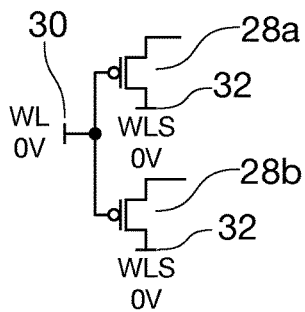  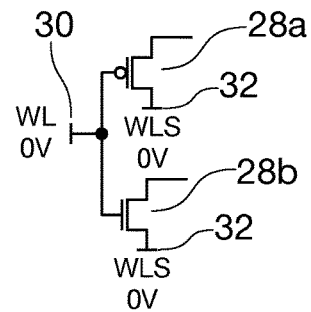  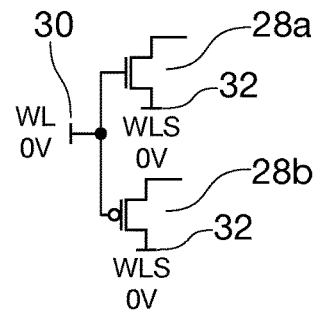
FIG. 7B    FIG. 7C    FIG. 7D

LOW LEAKAGE RERAM FPGA CONFIGURATION CELL

CROSS-REFERENCE TO RELATED APPLICATION

This patent application is a divisional application of U.S. patent application Ser. No. 15/375,014, entitled "Low Leakage ReRam FPGA Configuration Cell," filed Dec. 9, 2016 which claims the benefit of U.S. Provisional Patent Application Ser. No. 62/268,704, entitled "Low Leakage ReRam FPGA Configuration Cell," filed Dec. 17, 2015, which applications are incorporated by reference herein in their entirety.

BACKGROUND

1. Field of the Invention

The present invention relates to semiconductor technology. More particularly, the present invention relates to memory cell technology and to resistive random access memory cell technology. The present invention relates to low leakage resistive random access memory cells.

The contents of co-pending application Ser. No. 62/268,699, entitled LOW LEAKAGE RESISTIVE RANDOM ACCESS MEMORY CELLS AND PROCESSES FOR FABRICATING SAME; Ser. No. 62/401,875, entitled THREE-TRANSISTOR RESISTIVE RANDOM ACCESS MEMORY CELLS; and Ser. No. 62/402,927, entitled THREE-TRANSISTOR RESISTIVE RANDOM ACCESS MEMORY CELLS are expressly incorporated herein by reference in their entirety.

2. The Prior Art

Resistive random access memory (ReRAM) push-pull memory cells make an attractive configuration memory for advanced field-programmable gate array (FPGA) integrated circuits due to their small size and scalability. Examples of ReRAM memory devices and memory cells configured from those devices are disclosed in U.S. Pat. No. 8,415,650.

A ReRAM device is basically two metal plates, one of which serves as a metal ion source, separated by a solid electrolyte. The solid electrolyte has two states. In a first state (an "on" state), ions from the metal ion source have been forced into the electrolyte by placing a DC voltage having a first polarity across the ReRAM device and having a sufficient potential to drive metal ions from the ion-source plate into the electrolyte. In the first state, the ions form a conductive bridge through the solid electrolyte across which electrons can pass fairly easily. As the electrolyte becomes increasingly populated with metal ions, its resistivity, and hence the resistivity of the entire ReRAM device decreases. In a second state (an "off state), the electrolyte has been virtually depleted of ions by placing a DC voltage having a polarity opposite to that of the first potential and a potential sufficient to drive the metal ions from the electrolyte back into the ion-source plate across the ReRAM device. In the second state, absence of the ions makes it difficult for electrons to pass through the solid electrolyte. As the population of metal ions in the electrolyte decreases, its resistivity, and hence the resistivity of the entire ReRAM device increases. Amorphous silicon is a solid electrolyte and it is a leading candidate today for use in ReRAM devices.

ReRAM devices are often employed in a push-pull configuration to form a ReRAM memory cell as shown in FIG. 1. ReRAM memory cell 10 includes a first ReRAM device 12 in series with a second ReRAM device 14. In the ReRAM device symbols shown in FIG. 1, the wider (bottom) end of the ReRAM device is the end nearest its ion source. A voltage applied across the ReRAM device with its positive potential at the narrower (top) end of the ReRAM device will erase the device, i.e., set it to its "off" state, and a voltage applied across the ReRAM device with its positive potential at the wider (bottom) end of the ReRAM device will program the device, i.e., set it to its "on" state.

The ReRAM devices 12 and 14 are connected in series between a pair of complementary bitlines (BL) 16 (BL!) 18. Persons of ordinary skill in the art will appreciate that the value of the potentials applied to (BL) 16 and (BL!) 18 will be selected as a function of the particular feature size and other aspects of the technology employed. Typical operating voltages that are applied to (BL) 16 and (BL!) 18 are 1.5V and 0V, respectively.

In operation, one of ReRAM devices 12 and 14 will be set to its "on" state and the other will be set to its "off" state. Depending on which one of the ReRAM devices 12 and 14 is "on" and which one is "off" switch node 20 will either be pulled up to the voltage on BL 16 or pulled down to the voltage on BL! 18.

The gate of a switch transistor 22 is coupled to a switch node 20. The drain of the switch transistor 22 is connected to a first programmable node 24 and the source of the switch transistor is connected to a second programmable node 26. The first programmable node 24 can be connected to the second programmable node 26 by turning on the switch transistor 22.

If ReRAM device 12 is in its "on" state and ReRAM device 14 is in its "off" state, switch node 20 is pulled up to the voltage on BL 16, and switch transistor 22 will be turned on. If ReRAM device 12 is in its "off" state and ReRAM device 14 is in its "on" state, switch node 20 is pulled down to the voltage on BL! 18, and switch transistor 22 will be turned off. Persons of ordinary skill in the art will note that the entire potential between (BL) 16 and (BL!) 18 will exist across the one of ReRAM devices 12 and 14 that is in the "off" state.

A programming transistor 28 has a gate coupled to a word line (WL) 30. The drain of programming transistor 28 is connected to switch node 20 and its source is connected to a word line source (WLS) 32. In a typical application, ReRAM devices 12 and 14 are first erased (set to their "off" state) and then one of them is programmed (set to its "on" state) as described herein with reference to FIG. 5.

Referring now to FIG. 2, a cross sectional view of an illustrative semiconductor layout for a ReRAM cell 10 like that of FIG. 1 is shown. The ReRAM cell 10 is shown formed in a p-type semiconductor substrate 34, which may be a p-well structure as is known in the art. Shallow trench isolation (STI) regions 36 separate active regions for the switch transistor, the programming transistor and other adjacent structures. N-type doped region 38 forms the drain of the programming transistor and n-type region 40 forms its source. A contact 42 connects source 40 of the programming transistor to a first segment 44 of a first layer (M1) of metal interconnect forming WLS 32 described above. Polysilicon line 46 forms the gate of the programming transistor 28 and also acts as word line WL 30. Persons of ordinary skill in the art will appreciate that n-type region 40 can also serve as the source of a programming transistor for an adjacent ReRAM cell configured in a mirror cell arrangement with ReRAM memory cell 10 as is known in the art.

The switch transistor 22 is oriented orthogonally to the programming transistor 28 and polysilicon line 48 forms its gate. The source 26 and drain 24 regions of the switch transistor 22 are located in planes behind and in front of the plane of FIG. 2. Region 50 under the polysilicon line 48 is the channel of the switch transistor 22.

ReRAM device 12 is formed between a second segment 52 of the first layer (M1) of metal interconnect and a first segment 54 of a second layer (M2) of metal interconnect. An inter-metal contact 56 is shown connecting ReRAM device 12 to the first segment 54 of the second layer (M2) of metal interconnect. A second segment 58 of the second layer (M2) of metal interconnect serves as the bitline BL 16 and is connected to the second segment 52 of the first layer (M1) of metal interconnect by an inter-metal contact 60.

ReRAM device 14 is formed between a third segment 62 of the first layer (M1) of metal interconnect and a third segment 64 of the second layer (M2) of metal interconnect. The third segment 64 of the second layer (M2) of metal interconnect serves as the bitline BL! 18. An inter-metal contact 66 is shown connecting ReRAM device 14 to the third segment 64 of the second layer (M2) of metal interconnect.

An inter-metal contact 68 between the first segment 54 of the second layer (M2) of metal interconnect and the third segment 62 of the first layer (M1) of metal interconnect is used to make the connection between ReRAM device 12 and ReRAM device 14. Another pair of inter-metal contacts 70 and 72 and the third segment 62 of the first layer (M1) of metal interconnect are used to make the connection between the gate 48 of the switch transistor, the drain 38 of the programming transistor 28, and the common connection of the ReRAM devices 12 and 14.

ReRAM devices in the "off" state do not exhibit infinite resistance. ReRAM devices will therefore pass a leakage current in the "off" state if a voltage is impressed across them. For most normal memory applications, bits are only read when they are addressed. A transistor may be used to block any leakage current during times when the bit is not being read, and the leakage is therefore not overly problematic.

However, when using a ReRAM cell as a configuration memory for an FPGA, the cell statically drives the gate of a switch transistor to place the switch transistor in either its "on" or "off" state. In this application, the ReRAM cell is essentially always being read. Thus, the leakage current is always present across the ReRAM device that is in the "off" state, if a voltage is impressed thereacross, and is problematic.

Current investigations of the use of ReRAM memory cells as configuration memory in FPGA integrated circuits are academic in nature and ignore the cell leakage issue which presents a practical problem inhibiting the commercial application of this technology. Because the amount of "off" state leakage is an exponential function of the reverse, or "off" state, voltage across the ReRAM device it presents a significant obstacle to commercialization of ReRAM configuration memory in FPGA devices.

BRIEF DESCRIPTION

According to the present invention a low-leakage resistive random access memory cell includes a complementary pair of bit lines and a switch node. A first ReRAM device is connected to a first one of the bit lines. A p-channel transistor has a source connected to the ReRAM device, a drain connected to the switch node, and a gate connected to a bias potential. A second ReRAM device is connected to a second one of the bit lines. An n-channel transistor has a source connected to the ReRAM device a drain connected to the switch node, and a gate connected to a bias potential. A programming transistor has a drain connected to the switch node, a source connected to a source word line and a gate connected to a word line. A switch transistor has a gate connected to the switch node, a source connected to a first programmable node and a drain connected to a second programmable node.

BRIEF DESCRIPTION OF THE DRAWING FIGURES

FIG. 6 is a table showing voltages to be applied to the ReRAM memory array of FIG. 5 to erase and program the cells.

FIG. 7A is a schematic diagram showing another illustrative embodiment of a push-pull ReRAM cell in accordance with the present invention.

FIG. 7B is a schematic diagram showing a variation of the programming transistor portion of the push-pull ReRAM cell of FIG. 7A.

FIG. 7C is a schematic diagram showing another variation of the programming transistor portion of the push-pull ReRAM cell of FIG. 7A.

FIG. 7D is a schematic diagram showing yet another variation of the programming transistor portion of the push-pull ReRAM cell of FIG. 7A.

DETAILED DESCRIPTION

Persons of ordinary skill in the art will realize that the following description of the present invention is illustrative only and not in any way limiting. Other embodiments of the invention will readily suggest themselves to such skilled persons.

By adding two transistors to the cell in accordance with the present invention, the voltage across the "off" state ReRAM cell can be significantly reduced (e.g., to 0.5V or less) while maintaining the 1.5V drive on the switch transistor in a typical application as described herein. This can be done with only a minimal increase in area. Because the leakage is an exponential function of applied voltage, reducing the voltage across the "off" state ReRAM device in accordance with the present invention dramatically reduces the leakage through the "off" state ReRAM device, significantly improving the power dissipation.

Figure 1:
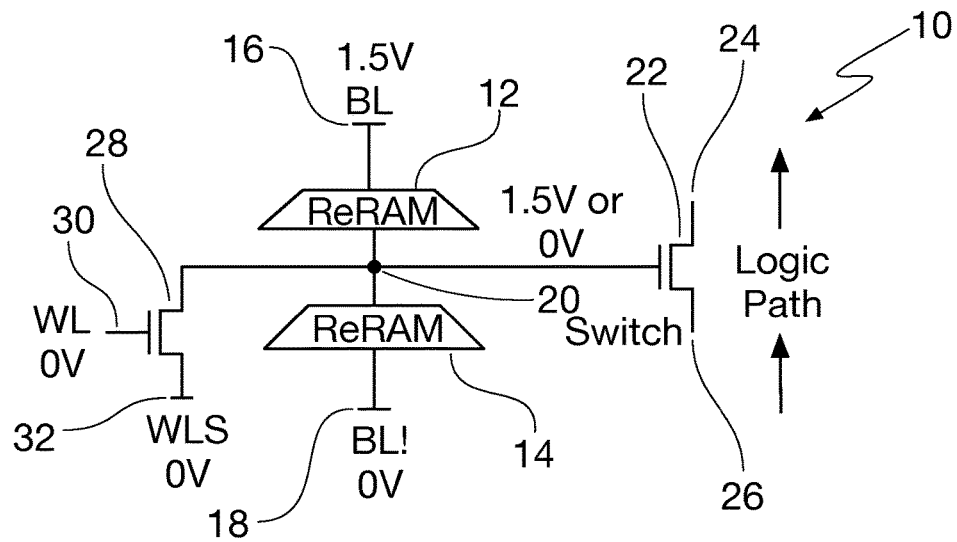
FIG. 1 is a schematic diagram of an illustrative prior-art push-pull ReRAM cell.
Figure 2:
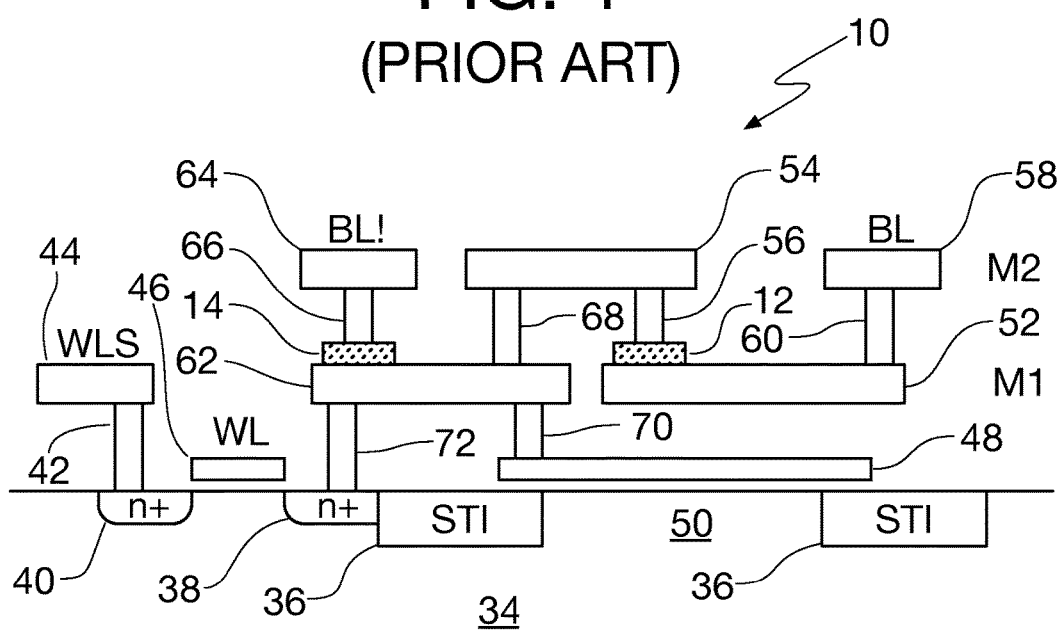
FIG. 2 is a cross sectional view of an illustrative semiconductor layout for a ReRAM cell like that shown in FIG. 1.
Figure 3A:
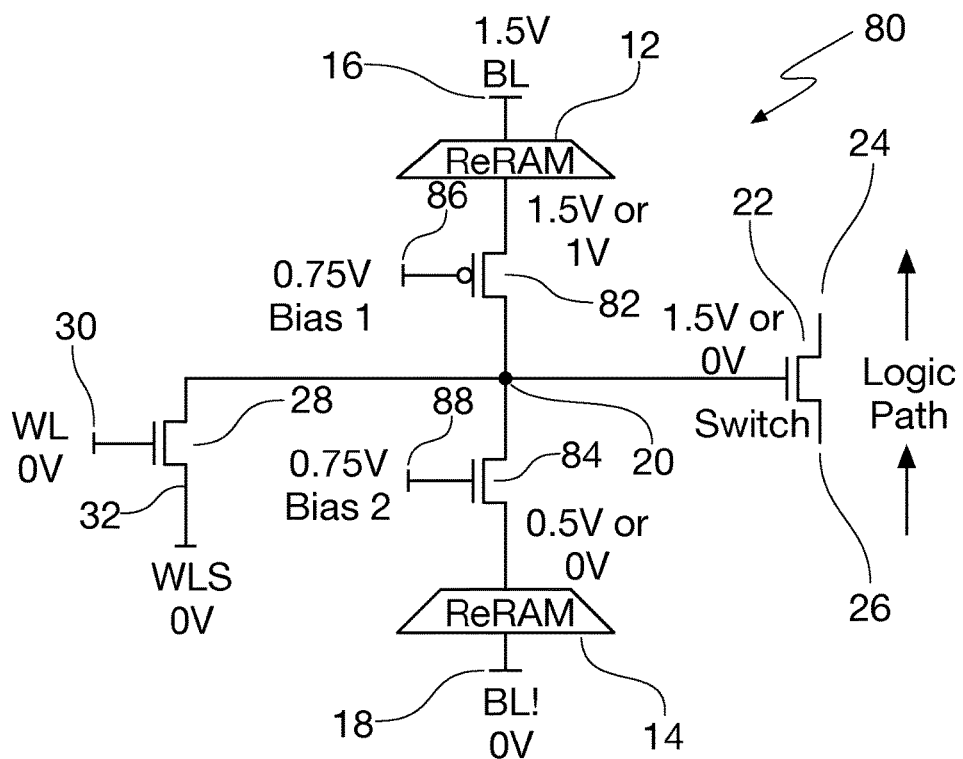
FIG. 3A is a schematic diagram of an illustrative push-pull ReRAM cell in accordance with the present invention.

Referring now to FIG. 3A, a schematic diagram shows an illustrative push-pull ReRAM cell 80 in accordance with the present invention. ReRAM memory cell 80 includes a first ReRAM device 12 having a first end coupled to bitline BL 16. A p-channel transistor 82 is coupled in series with a second end of first ReRAM device 12 and has its source connected to the second end of ReRAM device 12. The drain of p-channel transistor 82 is connected to a switch node 20.

A second ReRAM device 14 has a first end coupled to bitline BL! 18. An n-channel transistor 84 is coupled in series with a second end of second ReRAM device 14 and has its source connected to the second end of ReRAM device 14. The drain of n-channel transistor 84 is connected to the switch node 20. Persons of ordinary skill in the art will appreciate that the value of the potentials applied to (BL) 16 and (BL!) 18 will be selected as a function of the particular feature size and other aspects of the technology employed. Typical operating voltages that are applied to (BL) 16 and (BL!) 18 are 1.5V and 0V, respectively.

The gate of p-channel transistor 82 is connected to bias voltage node 86 to bias the gate with respect to its source. The gate of n-channel transistor 84 is connected to bias voltage node 88 to bias the gate with respect to its source. The bias voltages for the p-channel transistor 82 and n-channel transistor 84 to be applied to the respected bias voltage nodes 86 and 88 should be respectively chosen at design time to set the conductance of each of the p-channel and n-channel transistors so that each of ReRAM device 12 and ReRAM device 14 will have a voltage potential thereacross of between 0.25V to 0.5V more or less when it is in its "off" state. This bias voltage is nominally about 0.75V with respect to the source of the transistor for the voltages of 1.5V and 0V mentioned above, but, as noted, will vary given individual devices and processes.

A programming transistor 28 has a gate coupled to a word line (WL) 30. The drain of programming transistor 28 is connected to switch node 20 and its source is connected to a word line source (WLS) 32.

Selecting the voltage to which the ReRAM devices will be subjected in their "off" states involves an engineering tradeoff between the leakage of the off-state ReRAM device and the subthreshold conduction of the series transistor 82 or 84. The voltage selected in any particular situation will depend on the sizes and geometries of the ReRAM and transistor devices used, and the fabrication process employed. As noted, typical design tradeoffs should result in a voltage across the off-state ReRAM device in the range of 0.25V to 0.5V more or less when using operating voltages in the neighborhood of 1.5V. Higher voltages across the off-state ReRAM device will exponentially increase the ReRAM device leakage, and lower voltages will drop more of the off-state voltage across the series p-channel or n-channel transistor, causing more subthreshold conduction through the transistor. In a typical design, a current flow of no more than 100 pA more or less should be flowing through the off-state ReRAM device.

Figure 3B:
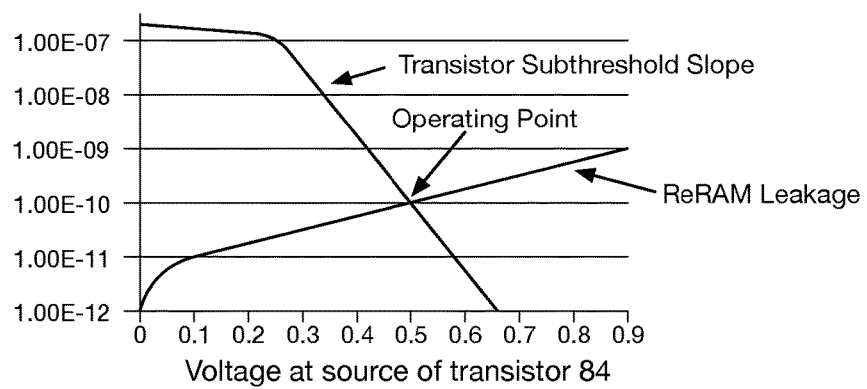
FIG. 3B is a plot showing the current vs. voltage characteristics of an off-state ReRAM device and a MOS transistor operating in subthreshold region.

FIG. 3B is a plot showing the current vs. voltage (I-V) characteristics of an n-channel MOS transistor having a $V_t$ of 0.5V, with its gate at 0.75V and operating in its subthreshold region superimposed on a plot of the leakage current of an "off" state ReRAM device. FIG. 3B shows an illustrative method for selecting the "off" state voltage of a ReRAM device in accordance with the present invention whereby the I-V characteristics of the ReRAM device and the transistor intersect at a selected ReRAM leakage current of 100 pA at a voltage of 0.5V and a transistor having a 0.5V $V_t$. Persons of ordinary skill in the art will readily understand that a similar plot can easily be developed for a p-channel transistor to help select an operating point.

In operation, as indicated above, one of ReRAM devices 12 and 14 will be set to its "on" state and the other will be set to its "off" state. Depending on which one of the ReRAM devices 12 and 14 is "on" and which one is "off" switch node 20 will either be pulled up to the voltage on BL 16 or pulled down to the voltage on BL! 18.

The gate of a switch transistor 22 is coupled to switch node 20. The drain of the switch transistor is connected to a first programmable node 24 and the source of the switch transistor is connected to a second programmable node 26. The first programmable node 24 can be connected to the second programmable node 26 by turning on the switch transistor 22.

If ReRAM device 12 is in its "on" state and ReRAM device 14 is in its "off" state, switch node 20 is pulled up to the voltage on BL 16, and switch transistor 22 will be turned on. If ReRAM device 12 is in its "off" state and ReRAM device 14 is in its "on" state, switch node 20 is pulled down to the voltage on BL! 18, and switch transistor 22 will be turned off. Persons of ordinary skill in the art will note that the entire potential between one of (BL) 16 and (BL!) 18 and the switch node 20 will not exist across the "off" state ReRAM device but will be shared across the one of ReRAM devices 12 and 14 that is in the "off" state and the one of p-channel transistor 82 and n-channel transistor 84 connected between it and the one of bitlines (BL) 16 and (BL!) 18 with which it is associated.

The offstate leakage in some ReRAM devices is a strong function of the reverse or "off" state voltage applied to the structure. The p-channel transistor 82 and n-channel transistor 84 serve to reduce the offstate voltage across the ReRAM devices to which they are directly connected to minimize the leakage. When ReRAM device 12 is in its "off" state and ReRAM device 14 is in its on state, the source of n-channel transistor 84 is at the voltage on bitline BL! (e.g., 0V) and its gate is at the voltage provided at bias voltage node 88, which for ease of understanding is shown as an exemplary 0.75V. Under these conditions, n-channel transistor 84 is turned on hard because its gate-to-source voltage is at the voltage of bias voltage node 88, and switch node 20 is pulled down to the voltage of bitline BL! (e.g., 0V). As a result, switch node 20 is pulled down to the voltage at bitline BL! (e.g., 0V). The gate of p-channel transistor 82 is at the voltage of bias voltage node 86, shown as an exemplary 0.75V. The source of p-channel transistor 84 is at around 1V more or less because the 1.5V between the bitline BL 16 and the switch node 20 is divided across the off-state ReRAM device 12 and the p-channel transistor 82 such that no more than about 0.25 to 0.5V more or less is across ReRAM device 12 to maintain the leakage current at, or below, the target maximum. Under these conditions the gate-to-source voltage of p-channel transistor 82 is only about −0.25V more or less and p-channel transistor 82 is operating in its subthreshold region as explained above in relation to FIG. 3B.

When ReRAM device 12 is in its on state and ReRAM device 14 is in its off state, the source of p-channel transistor 82 is at the voltage on bitline BL (e.g., 1.5V) and its gate is at the voltage provided at bias voltage node 88, which for ease of understanding is shown as an exemplary 0.75V. Under these conditions, p-channel transistor 82 is turned on hard because its gate-to-source voltage is −0.75V, i.e. the voltage of bias voltage node 88 less the voltage at bitline BL 16 (e.g. 1.5V), and switch node 20 is pulled up to the voltage on bitline BL. The gate of n-channel transistor 84 is at the voltage of bias voltage node 88, shown as an exemplary 0.75V. The source of n-channel transistor is at 0.5V more or less because the 1.5V between the bitline BL! 18 (0V) and the switch node 20 (1.5V) is divided across the off-state ReRAM device 14 and the n-channel transistor 84 such that only about 0.25 to 0.5V more or less is across ReRAM device 14 to maintain the leakage current at, or below, the target maximum. Under these conditions the gate-to-source voltage of n-channel transistor 84 is only around 0.25V more or less and n-channel transistor 84 is operating in its sub-threshold region as explained above in relation to FIG. 3B.

The bias voltage for bias voltage nodes 86 and 88 are set responsive to the inherent off-state resistance of the associated ReRAM device 12 or 14 so as to achieve the desired off-state potential thereacross, particular such that only about 0.25V to 0.5V, more or less, is across ReRAM device 12 or 14.

Persons of ordinary skill in the art will appreciate that the voltage values used in the above description of the operation of the ReRAM memory cell 80 are nominal values presented for the purposes of illustration.

Figure 4A:
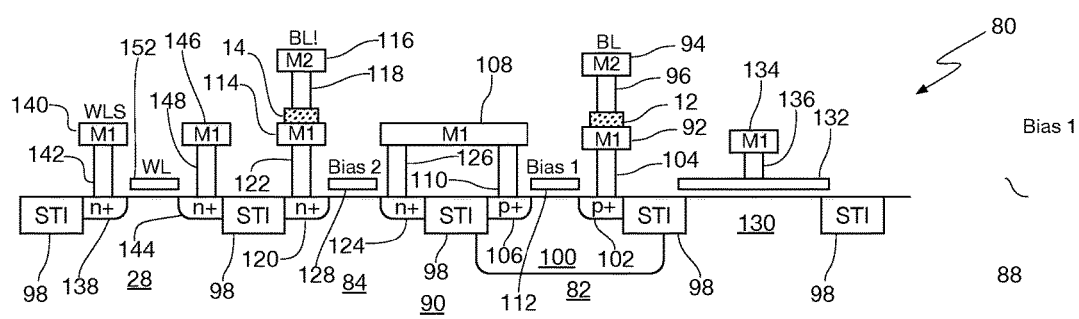
FIG. 4A is a cross-sectional view of an illustrative semiconductor layout for a ReRAM cell like that shown in FIG. 3A.
Figure 4B:
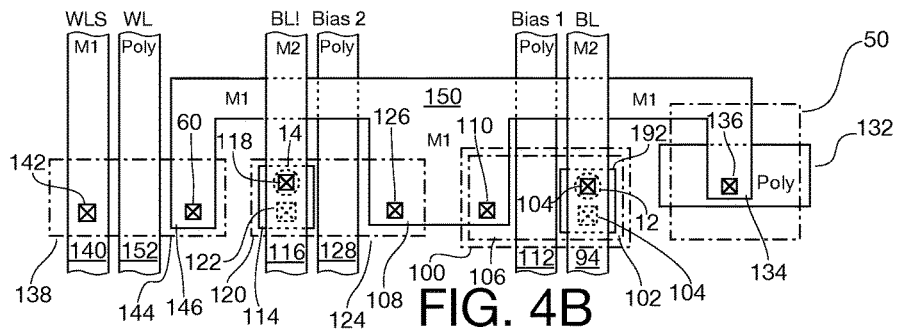
FIG. 4B is a top view of an illustrative semiconductor layout for a ReRAM cell like that shown in FIG. 3A.

Referring now to FIGS. 4A and 4B together, a cross-sectional view in FIG. 4A and a top view in FIG. 4B together show an illustrative semiconductor layout for a ReRAM cell 80 like that shown in FIG. 3A. Persons of ordinary skill in the art will appreciate that the layout shown in FIG. 4A and FIG. 4B is only one non-limiting example and that other layouts of the ReRAM cell of the present invention are possible and are intended to be within the scope of the present invention.

ReRAM cell 80 is formed in a semiconductor substrate 90, which, as understood by persons of ordinary skill in the art, could be a substrate or a well region formed within a semiconductor substrate on t which the integrated circuit containing it is fabricated. In the example shown in FIG. 4A, the substrate 90 is a p-type substrate.

ReRAM devices 12 and 14 are connected as a push-pull ReRAM cell. The ReRAM device 12 is formed on a segment 92 of a lower metal layer in the integrated circuit. The other end of ReRAM device 12 is connected to a bitline (BL) formed from a segment 94 of an upper metal layer by an inter-metal via 96. In the embodiment shown in FIG. 4A the upper and lower metal layers are a first metal interconnect layer (M1) and a second metal interconnect layer (M2) although persons of ordinary skill in the art will understand that this is not critical to the invention.

The transistors for the ReRAM cell 80 are formed in the substrate 90 and are separated from one another by isolations regions, shown as shallow trench isolation (STI) regions 98. P-channel transistor 82 is formed in n-well 100 (which is biased at the highest voltage in the circuit so as to never become forward biased) and has a source 102 connected to the metal segment 92 by via 104. The drain 106 of p-channel transistor 82 is connected to a segment 108 of the lower metal layer by a via 110. Segment 108 forms a part of the switch node 20 (FIG. 3A) of the ReRAM cell 90. The gate of p-channel transistor 82 is formed from polysilicon line 112 that is connected to a Bias 1 node to bias p-channel transistor 82 at about 0.75 V with respect to its source when the ReRAM memory cell is operated at a supply voltage of about 1.5V, as described above.

The ReRAM device 14 is formed on a segment 114 of the lower metal layer (M1) in the integrated circuit. The other end of ReRAM device 14 is connected to a bitline (BL!) formed from a segment 116 of the upper metal layer (M2) by an inter-metal via 118.

Segment 114 is connected to the source 120 of the n-channel transistor 84 by a via 122. The drain 124 of the n-channel transistor 84 is connected to the segment 108 by via 126. The gate of n-channel transistor 84 is formed from a polysilicon line 128 that is connected to a Bias 2 node to bias n-channel transistor 84 at about 0.75 V with respect to its source when the ReRAM memory cell is operated at a supply voltage of about 1.5V, as described above.

The switch transistor 22 of ReRAM cell 80 has a channel region 130 underneath its gate which is formed from a polysilicon segment 132. Polysilicon segment 132 is connected to metal segment 134 by via 136. As shown in FIG. 4B, segment 134 is connected to segment 108 and may be part of a single metal line.

N-channel programming transistor 28 has its source 138 connected to metal segment 140 by a via 142, serving as the word line source (WLS) 32 of the ReRAM cell 80. The drain 144 of programming transistor 28 is connected to metal segment 146 by a via 148. As shown in FIG. 4B, segment 146 is also connected to segments 108 and 134 and may be part of a single metal line 150 that constitutes the switch node 20. The gate of n-channel programming transistor 28 is formed from polysilicon line 152 that forms the word line 30 of the n-channel programming transistor 28.

Figure 5:
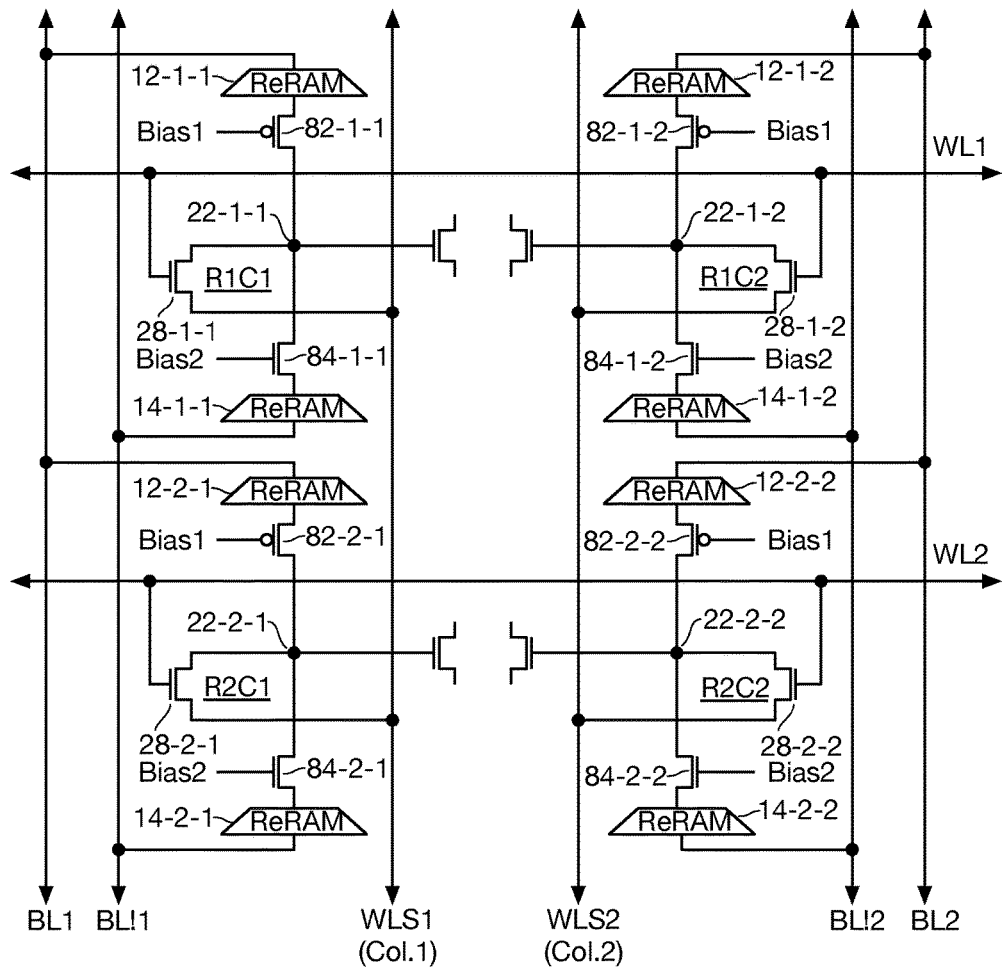
FIG. 5 is a schematic diagram depicting four illustrative ReRAM cells in an array to show a method for programming and erasing the ReRAM cells.

Referring now to FIG. 5, a schematic diagram depicts four illustrative ReRAM cells in an array to show a method for programming and erasing the ReRAM cells. The cells are identified by row and column location, R1C1 being the cell in the first row and first column, R1C2 being the cell in the first row second column, R2C1 being the cell in the second row and first column, and R2C2 being the cell in the second row second column.

The table of FIG. 6 shows the voltages to apply to the column lines, bit lines and word lines to perform the operations associated with each column of the table. The reference numeral designations used for the elements in FIG. 5 are the reference numerals used for these elements in FIG. 3A, followed by -x-y where x is the row of the array containing the element and y is the column of the array containing the element.

The voltages listed in FIG. 6 are nominal values and may vary in different designs as a function of the technology used. For example, 2.5V is applied to one of WL1 and WL2 for certain operations. The voltage actually necessary to perform these operations depends on the $V_t$ of the programming transistors 28 (e.g., about 0.4V) and will therefore normally be less than 2.5V, but 2.5V is chosen because it is a voltage that usually present anyway in the integrated circuit and so is a convenient choice. The same is true for the 1.8V voltage values, which are normally present in integrated circuits, 1.8V being a typical voltage available to overdrive transistor gates to eliminate the $V_t$ voltage drop across a turned on transistor.

Before programming any of the ReRAM cells, they are all erased by placing both of the ReRAM devices in the ReRAM cells to their "off" states.

Column A represents the voltages applied to erase (turn off) all upper ReRAM devices in the cells. When the voltages listed in column A of the table are applied to the array of FIG. 5, each of the programming transistors 28-1-1, 28-1-2, 28-2-1, and 28-2-2 in the four ReRAM memory cells R1C1, R1C2, R2C1, and R2C2 has 0V on its source and 1.8V on its gate and is turned on, placing each switch node 22-1-1, 22-1-2, 22-2-1, and 22-2-2 at 0V. The upper bitlines BL1 and BL2 each have 1.8V on them. Thus, the upper ReRAM devices 12-1-1, 12-1-2, 12-2-1, and 12-2-2 each have 1.8V across them, allowing current to flow through them to draw ions out of the electrolyte layer back to the ion source layer. The lower bitlines BL1! and BL2! each have 0V on them. Thus, the lower ReRAM devices 14-1-1, 14-1-2, 14-2-1, and 14-2-2 each have 0V across them, thus not allowing any current to flow through them.

Column B represents the voltages applied to erase all lower ReRAM devices in the cells. When the voltages listed in column B of the table are applied to the array of FIG. 5, each of the programming transistors 28-1-1, 28-1-2, 28-2-1, and 28-2-2 in the four ReRAM memory cells R1C1, R1C2, R2C1, and R2C2 has 1.8V on its source and 2.5V on its gate and is turned on, placing each switch node 22-1-1, 22-1-2, 22-2-1, and 22-2-2 at 1.8V. The lower bitlines BL1! and BL2! each have 0V on them. Thus, the lower ReRAM devices 14-1-1, 14-1-2, 14-2-1, and 14-2-2 each have 1.8V across them, allowing current to flow through them to draw ions out of the electrolyte layer back to the ion source layer. The upper bitlines BL1 and BL2 each have 1.8V on them. The upper ReRAM devices 12-1-1, 12-1-2, 12-2-1, and 12-2-2 thus each have 0V across them, not allowing any allowing current to flow through them.

Once all of the ReRAM cells have been erased, each ReRAM cell may be programmed to turn it "on" thereby turning on its associated switch transistor or to turn it "off" thereby turning off its associated switch transistor. As described below, the programming is accomplished responsive to the proper bias of the bitlines, word lines and respective programming transistor.

Column C represents the voltages applied to turn on the ReRAM cell at R1C1 by turning on the upper ReRAM device 12-1-1 in that cell to pull up the switch node to turn on the switch transistor. When the voltages listed in column C of the table are applied to the array of FIG. 5, programming transistor 28-1-1 has 1.8V on its source, 2.5V on its gate and will be turned on, driving the switch node 22-1-1 in ReRAM cell R1C1 to 1.8V. Bitline BL1 has 0V on it, and ReRAM device 12-1-1 will therefore have a voltage of 1.8V across it, the bottom end being more positive than the top end. This is the condition for programming ReRAM device 12-1-1. ReRAM device 14-1-1 will also have a voltage of 1.8V across it, but the bottom end is more negative than the top end and therefore ReRAM device 14-1-1 will not be programmed.

Programming transistor 28-1-2 has 0V on its source, 2.5V on its gate and will be turned on, driving the switch node 22-1-2 in ReRAM cell R1C2 to 0V. Because BL2 and BL2! both have 0V on them, both ReRAM devices 12-1-2 and 14-1-2 in ReRAM cell R1C2 will have 0V across them and will not be programmed.

Programming transistors 28-2-1 and 28-2-2 each has 0V on its gate and will be turned off. The switch nodes 22-2-1 and 22-2-2 in ReRAM cells R2C1 and R2C2 will be either floating or at the potential on both bitlines BL2 and BL2! if one of the ReRAM devices in those cells has been programmed. Since bitlines BL2 and BL2! are both at 0V, no ReRAM devices in cells R2C1 and R2C2 in the second row of the array will be programmed.

Column D represents the voltages applied to turn off the ReRAM cell at R1C1 by turning on the lower ReRAM device 14-1-1 in that cell to pull down the switch node 22-1-1 to turn off the associated switch transistor. When the voltages listed in column D of the table are applied to the array of FIG. 5, programming transistor 28-1-1 has 0V on its source, 2.5V on its gate and will be turned on, driving the switch node 22-1-1 in ReRAM cell R1C1 to 0V. Bitline BL!1 has 1.8V on it, and ReRAM device 14-1-1 will have a voltage of 1.8V across it, the bottom end being more positive than the top end. This is the condition for programming ReRAM device 14-1-1. ReRAM device 12-1-1 will also have a voltage of 1.8V across it, but the bottom end is more negative than the top end and therefore ReRAM device 12-1-1 will not be programmed.

Programming transistor 28-1-2 has 1.8V on its source, 2.5V on its gate and will be turned on, driving the switch node 22-1-2 in ReRAM cell R1C2 to 1.8V. Because BL2 and BL2! both have 1.8V on them, both ReRAM devices 12-1-2 and 14-1-2 in ReRAM cell R1C2 will have 0V across them and will not be programmed.

Programming transistors 28-2-1 and 28-2-2 each has 0V on its gate and will be turned off. The switch nodes 22-2-1 and 22-2-2 in ReRAM cells R2C1 and R2C2 will be either floating or at the potential on both bitlines BL2 and BL2! if one of the ReRAM devices in those cells has been programmed. All bitlines are at 1.8V, but because the switch nodes 22-2-1 and 22-2-2 are either floating or at the potential of bitlines BL2 and BL!2, no ReRAM devices in cells R2C1 and R2C2 in the second row of the array will be programmed.

Column E represents the voltages applied to turn on the ReRAM cell at R1C2 by turning on the upper ReRAM device 12-1-2 in that cell to pull up the switch node 22-1-2 to turn on the associated switch transistor. The conditions are similar to those for column C, except that the source of programming transistor 28-1-2 is now at 1.8V and is turned on (and the source of transistor 28-1-1 is now at 0V) and ReRAM device 12-1-2 is programmed because it has 0V at its top end and 1.8V on its bottom end. ReRAM device 14-1-2 will also have a voltage of 1.8V across it, but its bottom end is more negative than its top end and therefore ReRAM device 14-1-2 will not be programmed. Persons of ordinary skill in the art will appreciate that the ReRAM cells in the second row of the array are not programmed for the reasons set forth in the explanation of the column C conditions.

Column F represents the voltages applied to turn off the ReRAM cell at R1C2 by turning on the lower ReRAM device 14-1-2 in that cell to pull down the switch node 22-1-2 to turn off the associated switch transistor. When the voltages listed in column F of the table are applied to the array of FIG. 5, programming transistor 28-1-2 has 0V on its source, 2.5V on its gate and will be turned on, driving the switch node 22-1-2 in ReRAM cell R1C2 to 0V. Bitline BL2! has 1.8V on it, and ReRAM device 14-1-2 will have a voltage of 1.8V across it, since bitline BL2 has 1.8V on it, the bottom end being more positive than the top end. This is the condition for programming ReRAM device 14-1-2. ReRAM device 12-1-2 will also have a voltage of 1.8V across it, but the bottom end is more negative than the top end and therefore ReRAM device 12-1-2 will not be programmed.

Programming transistor 28-1-1 has 1.8V on its source, 2.5V on its gate and will be turned on, driving the switch node 22-1-1 in ReRAM cell R1C1 to 1.8V. Because BL1 and BL1! both have 1.8V on them, both ReRAM devices 12-1-1 and 14-1-1 in ReRAM cell R1C1 will have 0V across them and will not be programmed.

Programming transistors 28-2-1 and 28-2-2 each has 0V on its gate and will be turned off. The switch nodes 22-2-1 and 22-2-2 in ReRAM cells R2C1 and R2C2 will be either floating or at the potential on both bitlines BL1 and BL1! if one of the ReRAM devices in those cells has been programmed. All bitlines are at 1.8V, but because the switch nodes 22-2-1 and 22-2-2 are either floating or at the potential of bitlines BL1 and BL2!, no ReRAM devices in cells R2C1 and R2C2 in the second row of the array will be programmed.

Column G represents the voltages applied to turn on the ReRAM cell at R2C1 by turning on the upper ReRAM device 12-2-1 in that cell to pull up the switch node 22-2-1 to turn on the associated switch transistor. Column H represents the voltages applied to turn off the ReRAM cell at R2C1 by turning on the lower ReRAM device 14-2-1 in that cell to pull down the switch node 22-2-1 to turn off the associated switch transistor. Column I represents the voltages applied to turn on the ReRAM cell at R2C2 by turning on the upper ReRAM device 12-2-2 in that cell to pull up the switch node 22-2-2 to turn on the associated switch transistor. Column J represents the voltages applied to turn off the ReRAM cell at R2C1 by turning on the lower ReRAM device 14-2-2 in that cell to pull down the switch node 22-2-1 to turn off the associated switch transistor. From the conditions described with reference to columns C through F for programming the ReRAM cells in the first row of the array to either their "on" or "off" states, persons of ordinary skill in the art will readily appreciate from FIG. 5 and FIG. 6 how the programming of ReRAM cells R2C1 and R2C2 in the second row of the array is accomplished.

Referring now to FIG. 7A, a schematic diagram shows another illustrative embodiment of a push-pull ReRAM cell 160 in accordance with the present invention. The ReRAM cell 160 is similar to the ReRAM cell 80 of FIG. 3A and reference numerals designating features of ReRAM cell 160 that are the same as features in the ReRAM cell 80 of FIG. 3A will be designated using the same reference numerals used in FIG. 3A.

ReRAM cell 160 includes a first ReRAM device 12 having a first end coupled to bitline BL 16. A p-channel transistor 82 is coupled in series with a second end of first ReRAM device 12 and has its source connected to the second end of ReRAM device 12. The drain of p-channel transistor 82 is connected to a switch node 20.

A second ReRAM device 14 has a first end coupled to bitline BL! 18. An n-channel transistor 84 is coupled in series with a second end of second ReRAM device 14 and has its source connected to the second end of ReRAM device 14. The drain of n-channel transistor 84 is connected to the switch node 20. Persons of ordinary skill in the art will appreciate that the value of the potentials applied to (BL) 16 and (BL!) 18 will be selected as a function of the particular feature size and other aspects of the technology employed. Typical operating voltages that are applied to (BL) 16 and (BL!) 18 are 1.5V and 0V, respectively.

The gate of p-channel transistor 82 is connected to bias voltage node 86 to bias the gate with respect to its source. The gate of n-channel transistor 84 is connected to bias voltage node 88 to bias the gate with respect to its source. As with the ReRAM cell 80 of FIG. 3A, the bias voltages for the p-channel transistor 82 and n-channel transistor 84 to be applied to the respected bias voltage nodes 86 and 88 should be respectively chosen at design time to set the conductance of each of the p-channel and n-channel transistors so that each of ReRAM device 12 and ReRAM device 14 will have a voltage potential thereacross so as to achieve the target maximum "off"-stage leakage current, the voltage potential being between 0.25V to 0.5V more or less at the target "off" state current leakage when it is in its "off" state. This bias voltage is nominally about 0.75V with respect to the source of the transistor for the voltages of 1.5V and 0V mentioned above, but, as noted, will vary given individual devices and processes and target maximum "off"-stage leakage current.

The difference between ReRAM cell 160 and ReRAM cell 80 of FIG. 3A is that in the ReRAM cell 80 of FIG. 3A, a single programming transistor 28 has a gate coupled to a word line (WL) 30, the drain of programming transistor 28 is connected to switch node 20 and its source is connected to a word line source (WLS) 32. In the ReRAM cell 160 of FIG. 7A, a pair of programming transistors 28a and 28b are employed. As illustrated in FIG. 7A, programming transistor 28a is an n-channel transistor having its gate coupled to a word line (WL) 30, its drain coupled to the second end of ReRAM device 12, and its source coupled to a word line source (WLS) 32. Programming transistor 28b is an n-channel transistor having its gate coupled to the word line (WL) 30, its drain coupled to the second end of ReRAM device 14, and its source coupled to the word line source (WLS) 32. Other variations of this circuit are intended to fall within the scope of the present invention, and include embodiments where programming transistors 28a and 28b are both p-channel transistors (as illustrated in FIG. 7B), where programming transistor 28a is a p-channel transistor and programming transistor 28b is an n-channel transistor (as illustrated in FIG. 7C), and where programming transistor 28a is an n-channel transistor and programming transistor 28b is a p-channel transistor (as illustrated in FIG. 7D).

ReRAM cell 160 is larger than ReRAM cell 80, as it requires another programming transistor, but has the advantage that the cell can be programmed and erased using a current path that does not include the p-channel and n-channel bias transistors 82 and 84, and switch node 20, allowing higher currents to be used during programming. The bias of switch node 20 is irrelevant during programming and erasing. During programming, the cell to be programmed or erased is selected using the WL and WLS lines 30 and 32, and the choice of which of ReRAM devices 12 and 14 is to be programmed or erased is selected by applying the appropriate voltages to bitlines BL 16 and BL! 18.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A low-leakage resistive random-access memory (ReRAM) cell comprising:
   a complementary pair of bit lines;
   a switch node;
   a first ReRAM device having a first end connected to a first one of the bit lines;
   a p-channel transistor having a source connected to a second end of the first ReRAM device, a drain connected to the switch node, and a gate connected to a first bias potential;
   a second ReRAM device having a first end connected to a second one of the bit lines;
   an n-channel transistor having a source connected to a second end of the second ReRAM device, a drain connected to the switch node, and a gate connected to a second bias potential;
   a first programming transistor connected between the source of the p-channel transistor and a word line source node, the first programming transistor having a gate coupled to a word line; and
   a second programming transistor connected between the source of the n-channel transistor and the word line source node, the second programming transistor having a gate coupled to the word line.

2. The ReRAM cell of claim 1, wherein the first programming transistor is an n-channel transistor and the second programming transistor is an n-channel transistor.

3. The ReRAM cell of claim 1, wherein the first programming transistor is a p-channel transistor and the second programming transistor is a p-channel transistor.

4. The ReRAM cell of claim 1, wherein the first programming transistor is a p-channel transistor and the second programming transistor is an n-channel transistor.

5. The ReRAM cell of claim 1, wherein the first programming transistor is an n-channel transistor and the second programming transistor is a p-channel transistor.

6. The ReRAM cell of claim 1 further including a switch transistor having a gate connected to the switch node, a source connected to a first programmable node and a drain connected to a second programmable node.

7. The ReRAM cell of claim 1 wherein the first and second ReRAM devices are formed between a lower metal interconnect line and an upper metal interconnect line in an integrated circuit.

8. The ReRAM cell of claim 7 wherein lower metal interconnect line is a first metal interconnect line and the upper metal interconnect line is a second metal interconnect line.

\* \* \* \* \*